US007777657B2

(12) United States Patent
Sandler et al.

(10) Patent No.: US 7,777,657 B2
(45) Date of Patent: Aug. 17, 2010

(54) SIGMA DELTA MODULATORS

(76) Inventors: Mark Brian Sandler, 91 Bow Lane, London N12 0JL (GB); Joshua Daniel Reiss, 26 Regency Court, Park Close, London (GB) E9 7TP ( * ) Notice: Subject to any disclaimer, the term of this patent is extended or adjusted under 35 U.S.C. 154(b) by 0 days.

(21) Appl. No.: 11/995,804

(22) PCT Filed: Jun. 29, 2006

(86) PCT No.: PCT/GB2006/050175
§ 371 (c)(1),
(2), (4) Date: Aug. 13, 2008

(87) PCT Pub. No.: WO2007/010298
PCT Pub. Date: Jan. 25, 2007

(65) Prior Publication Data
US 2008/0309529 A1  Dec. 18, 2008

(30) Foreign Application Priority Data
Jul. 18, 2005  (GB)  ................................. 0514677.4

(51) Int. Cl.
*H03M 3/00*  (2006.01)
(52) U.S. Cl. ........................ 341/143; 341/155
(58) Field of Classification Search .............. 341/143, 341/155, 131, 165, 166, 120
See application file for complete search history.

(56) References Cited
U.S. PATENT DOCUMENTS 5,191,331 A * 3/1993 Karema et al. .............. 341/131
5,200,750 A   4/1993 Fushiki et al. .............. 341/143
5,909,188 A * 6/1999 Tetzlaff et al. .............. 341/155
5,986,512 A * 11/1999 Eriksson ....................... 331/16
7,002,497 B2 * 2/2006 Brooks .......................... 341/131

(Continued)

FOREIGN PATENT DOCUMENTS

EP  1 202 461  3/2005

(Continued)

OTHER PUBLICATIONS

De Jager, F., "Delta modulation—a method of {PCM} transmission using the one unit code," *Phillips Research Report*, 1952, 7, 442-466.

(Continued)

*Primary Examiner*—Brian Young
(74) *Attorney, Agent, or Firm*—Woodcock Washburn LLP

(57) ABSTRACT

A method is provided for detecting limit cycles in a sigma delta modulator having an output signal that varies over a series of time intervals. In this method a first value that is indicative of the level of the modulator output signal after a predetermined time interval is stored in a first memory, and a second value that is indicative of the level of the modulator output signal after a further time interval subsequent to the predetermined time interval is stored in a second memory. The first value stored in the first memory is compared with the second value stored in the second memory, and an output indicative of a tendency for limit cycles to be produced in the modulator output signal is provided in response to such comparison. Such a method is particularly advantageous for detecting limit cycles in a sigma delta modulator as it can be implemented in a straightforward manner and offers a very accurate limit cycle detection mechanism. As a result it only becomes necessary to activate a limit cycle removal mechanism when limit cycle behavior has been observed, and major changes to design are not normally required to implement the detection mechanism.

26 Claims, 8 Drawing Sheets

U.S. PATENT DOCUMENTS

| | | | |
|---|---|---|---|
| 7,009,543 B2 * | 3/2006 | Melanson | 341/143 |
| 7,471,223 B2 * | 12/2008 | Lee | 341/131 |
| 2002/0040284 A1 | 4/2002 | Junk | 702/189 |
| 2004/0036636 A1 | 2/2004 | Mai et al. | 341/131 |

FOREIGN PATENT DOCUMENTS

| | | |
|---|---|---|
| JP | 10107589 | 4/1998 |
| KR | 10 1998 0011248 A | 3/1998 |
| KR | 10 2003 7016939 A | 12/2003 |
| WO | WO 99/44289 A1 | 9/1999 |
| WO | WO 03/003583 A2 | 1/2003 |
| WO | WO 2007/010298 | 1/2007 |

OTHER PUBLICATIONS

Norsworthy et al., *Delta-Sigma Data Converters*: IEEE Press, 1997.

Risbo, L., "Sigma-Delta Modulators—Stability Analysis and Optimization," PhD Thesis, *Electronics Institute*. Lyngby: Technical University of Denmark, 1994, p. 179, http://eivind.imm.dtu.dk/publications/phdthesis.html.

Hein et al., *Sigma Delta Modulators: nonlinear decoding algorithms and stability anaylsis*. New York: Kluwer Academic Publishers, 1993.

Ardalan et al., "An Analysis of Nonlinear Behavior in Delta-Sigma Modulators," IEEE *Transactions on Circuits and Systems 1: Fundamental Theory and Applications*, 1987, 34, 593-603.

Magrath, A.J., "Algorithms and Architectures for High Resolution Sigma-Delta Converters," PhD Thesis, *Electronic Engineering*, London, King's College, University of London, 1996.

Mann et al., "Limit cycle behavior in the double-loop bandpass Sigma Delta A/D converter," IEEE *Transactions on Circuits and Systems-11*, 1999, 46, 1086-1089.

Bridgett et al., "Effect of initial conditions on limit cycle performance of second order sampled data sigma delta modulator," *Electronic Letters*, 1990, 26, 817-819.

Friedman, V., "The Structure of limit cycles in sigma delta modulation," *IEEE Trans. Communication*, 1988, 36, 972-979.

Reiss et al., "The harmonic content of a limit cycle in a DED bitsteam," Proceedings of the Audio Engineering Society $116^{th}$ Convention, Berlin, Germany, 2004.

Reefman et al., Description of Limit Cycles in Feedback Sigma Delta Modulators, Proceedings of the Audio Engineering Society $117^{th}$ Convention, San Fransisco, USA, 2004.

Reefman et al., "Description of limit cycles in Sigma Delta Modulators," accedpted for IEEE Transactions on Circuits and Systems 1, 2004, p. 30.

Reiss et al., "They Exist: Limit Cycles in Hihgh Order Sigma Delta Modulators," Proceedings of the $114^{th}$ Convention of the Audio Engineering Society, Amsterdam, The Netherlands, 2003.

Reefman et al., Stability Analysis of Limit Cycles in High Order Sigma Delta Modulators, Proceedings of the Audio Engineering Society $115^{th}$ Convention, New York, New York, 2003.

Lipshitz et al., "Towards a Better Understanding of t-Bit Sigma-Delta Modulators," Proceedings of the Audio Engineering Society $110^{th}$ Convention, Amsertdam, Holland, 2001.

Reefman et al., "Signal processing for Direct Stream Digital: A tutorial for digital Sigma Delta modulation and t-bit digital audio processing," Phillips Research, Eindhoven, White Paper 18, 2002.

Magrath, A.J. et al., "Efficient Dithering of Sigma-Delta Modulators with Adaptive Bit Flipping," *Electronics Letters*, 1995, 31(11), 846-847.

Reefman et al., "Description of Limit Cycles in Feedback Sigma Delta Modulators," *IEEE Transactions on Circuits and Systems Part I: Regular Papers*, IEEE Service Center, New York, NY, Jun. 2005, 52(6), 1211-1223.

International Preliminary Report on Patentability issued Jan. 22, 2008 in corresponding International Application No. PCT/GB2006/050175.

EP Communication from the Examining Division dated Aug. 1, 2008 in corresponding Application No. 06744355.6.

KR Application No. 2008-7003731: Decision for Grant of Patent, dated Mar. 18, 2010.

* cited by examiner

SIGMA DELTA MODULATORS

CROSS-REFERENCE TO RELATED APPLICATIONS

This application is the National Phase of International Application No. PCT/GB2006/050175 filed Jun. 29, 2006, which claims the benefit of Great Britain Application No. 0514677.4 filed Jul. 18, 2005, the disclosures of which are incorporated herein by reference in their entirety.

This invention relates to sigma delta modulators.

Sigma delta modulation is a popular method of converting electrical signals from analogue to digital form, and vice versa. Such a modulation technique typically involves converting an analogue electrical signal into a low-bit, highly oversampled digital representation. Furthermore the technique benefits greatly from the oversampling in that a feedback path may be used to shape the quantization noise into high frequencies where it is not noticeable. Due to its low circuit complexity and robustness against circuit imperfections, one-bit sigma delta-based analogue-to-digital and digital-to-analogue converters are widely used in audio applications, such as cellular phone technology and high-end stereo systems.

FIG. 1 is a circuit diagram showing a generic example of a feedforward sigma delta converter often used in analogue to digital conversion. This converter uses a feedback system having an input line 11 for an analogue input signal to be converted terminating at a loop filter 12 containing a number of integrators corresponding to the order of the sigma delta modulator. Each integrator outputs a state space variable that is multiplied by a suitable coefficient in a respective amplifier 13, the outputs of all the amplifiers 13 being summed in an adder 14. The resulting summed output is quantised to plus or minus one in a quantiser 15, depending on the sign of the sum, and the quantised value is passed to the output line 16 as the output bit, and also subtracted from the input signal supplied on the input line 11.

However, sigma delta modulators may suffer from limit cycles in which the output bits enter a repeating pattern, and current methods of preventing this phenomenon introduce unwanted noise, do not always succeed, and are often implemented when not needed.

Sigma delta modulation, as originally conceived by F. de Jager, "Delta modulation—a method of {PCM} transmission using the one unit code", Philips Research Report, vol. 7, pp. 442-466, 1952, is a well-established technique. However, theoretical understanding of the concept is limited, as indicated by S. Norsworthy, R. Schreier, and G. Temes, "Delta-Sigma Data Converters", IEEE Press, 1997. The most important progress in the description of sigma delta modulators has been made by L. Risbo, "Sigma-Delta Modulators—Stability Analysis and Optimization," PhD Thesis, Electronics Institute. Lyngby: Technical University of Denmark, 1994, pp. 179, and S. Hein and A. Zakhor, "Sigma Delta Modulators: nonlinear decoding algorithms and stability analysis", New York, Kluwer Academic Publishers, 1993, while a useful linearization technique is described in S. H. Ardalan and J. J. Paulos, "An Analysis of Nonlinear Behavior in Delta-Sigma Modulators", IEEE Transactions on Circuits and Systems I: Fundamental Theory and Applications, vol. 34, pp. 593-603, 1987, and further elaborated on by A. J. Magrath, "Algorithms and Architectures for High Resolution Sigma-Delta Converters", PhD Thesis, Electronic Engineering, London, King's College, University of London, 1996. Yet in all these developments, there is no unified description of Sigma delta modulators (SDMs). Instead, several models are provided, each of which describes some aspects of an SDM to a certain accuracy.

Fundamental work on limit cycles in SDMs has usually been constrained to low order SDMs, such work including that of S. I. Mann and D. P. Taylor, "Limit cycle behavior in the double-loop bandpass Sigma Delta A/D converter", IEEE Transactions on Circuits and Systems-II, vol. 46, pp. 1086-1089, 1999, N. Bridgett and C. P. Lewis, "Effect of initial conditions on limit cycle performance of second order sampled data sigma delta modulator", Electronics Letters, vol. 26, pp. 817-819, 1990, and V. Friedman, "The Structure of limit cycles in sigma delta modulation", IEEE Trans. Communication, vol. 36, pp. 972-979, 1988, and hence is of little practical value to engineers who use high order noise shaping techniques. Recent work has significantly advanced the theory of limit cycles in sigma delta modulators, such work including J. D. Reiss and M. Sandler, "The harmonic content of a limit cycle in a DSD bitstream", Proceedings of the Audio Engineering Society 116th Convention, Berlin, Germany, 2004, J. D. Reiss and M. B. Sandler, "They Exist: Limit Cycles in High Order Sigma Delta Modulators," Proceedings of the 114th Convention of the Audio Engineering Society, Amsterdam, The Netherlands, 2003, and D. Reefman, J. D. Reiss, E. Janssen, and M. B. Sandler, "Stability Analysis of Limit Cycles in High Order Sigma Delta Modulators", Proceedings of the Audio Engineering Society 115th Convention, New York, N.Y., 2003. Most notably, in D. Reefman, J. D. Reiss, E. Janssen, and M. Sandler, "Description of limit cycles in Sigma Delta Modulators", accepted for IEEE Transactions on Circuits and Systems 1, pp. 30, 2004, results were derived concerning the character of limit cycles for a general feedforward (also called interpolative), and on their stability in particular. In D. Reefman, J. D. Reiss, E. Janssen, and M. Sandler, "Description of Limit Cycles in Feedback Sigma Delta Modulators", Proceedings of the Audio Engineering Society 117th Convention, San Francisco, USA, 2004, similar results were obtained for feedback sigma delta modulators.

Limit cycle prevention is typically achieved by adding a signal, with a uniform or triangular probability distribution, just prior to quantisation, as described in S. P. Lipshitz and J. Vanderkooy, "Towards a Better Understanding of 1-Bit Sigma-Delta Modulators", Proceedings of the Audio Engineering Society 110th Convention, Amsterdam, Holland, 2001. When an appropriate dithering sequence is added, an output bit may be flipped (output bit changed from +1 to −1, or from −1 to +1), and the periodic output pattern might be destroyed. However, the dither decreases the signal-to-noise ratio, the stability, and the dynamic range of the sigma delta modulator. Furthermore, it is added when it is not needed, and in many situations may not be sufficient to destroy a limit cycle.

Reference may also be made to the following prior art references that disclose arrangements for avoiding the occurrence of limit cycles, or for providing a stand-alone limit cycle removal mechanism.

CA1078463 discloses a digital filter circuit, but is restricted to second order recursive digital filters that are fundamentally different to sigma delta modulators (of arbitrary order). EP1394942 is concerned with a limit cycle oscillation suppression method that is restricted to digital filters with a specific type of input. It does not apply to sigma delta modulation.

U.S. Pat. No. 6,825,784 relates to a dithering method for sigma-delta analogue-to-digital converters that reduces idle tones (which are distinctly different to limit cycles) and does not have a limit cycle detection window. WO2004004131 discloses a method for sigma-delta conversion with reduced idle tones using the technique of dithering the quantiser input to remove limit cycles. The method uses an alternate dither generation mechanism. It does not detect limit cycles, and uses a sub-optimal method of limit cycle removal. U.S. Pat. No. 6,175,321 discloses a method for the reduction of periodic noise in a sigma delta modulator by applying dither in the feedback loop, which is preferable to dithering the quantiser. This method does not detect limit cycles.

US2004036636 describes tone-free dithering methods for sigma-delta DAC and applies dithering in (or prior to) the feedback loop to remove limit cycles. The method does not detect the limit cycles. JP55071315 relates to a limit cycle reduction system of a digital filter that will only remove limit cycles that occur when there is no input signal. It also affects the output of the SDM when there is no input but the system is not in a limit cycle. U.S. Pat. No. 4,321,685 is concerned with a circuit for reducing the limit cycle in a digital filter that suffers from the same disadvantages as the circuit of JP55071315.

JP2003273740 relates to a D/A conversion device that suffers from the same disadvantages as the circuits of JP55071315 and U.S. Pat. No. 4,321,685. JP4317224 discloses a sigma-delta modulator for a D/A converter that uses a random value in a bit of one of the quantisers in order to prevent limit cycles from occurring. This does not guarantee that they are removed, and it may not prevent short term limit cycles. Furthermore, it cannot detect the limit cycles.

It is an object of the present invention to provide more effective methods for detecting and removing unwanted limit cycles at the output of a sigma delta modulator.

According to one aspect of the present invention there is provided a circuit for detecting limit cycles in a sigma delta modulator having an output signal that varies over a series of iterations with respect to time, the circuit comprising:

first memory means for storing a first value indicative of the level of the modulator output signal after a predetermined iteration;

second memory means for storing a second value indicative of the level of the modulator output signal after a further iteration subsequent to the predetermined iteration;

comparison means for comparing said first value stored in the first memory means with said second value stored in the second memory means; and detection means for providing, in response to such comparison, an output indicative of a tendency for limit cycles to be produced in the modulator output signal.

Such a circuit is particularly advantageous for detecting limit cycles in a sigma delta modulator as it can be implemented in a straightforward manner and offers a very accurate limit cycle detection mechanism. As a result it only becomes necessary to activate a limit cycle removal mechanism when limit cycle behaviour has been observed, and major changes to design are not normally required to implement the detection mechanism. Furthermore the detection mechanism can be adapted to detect short-term limit cycles. Compared with conventional methods, sigma delta modulation has less SNR penalty and the mechanism is simple to implement. Moreover, sigma delta modulation has a higher allowed input dynamic range than conventional modulator dithering schemes. Analogue and digital implementations of the limit cycle detection and removal schemes are possible for both feedforward and feedback designs.

Such a circuit may take several forms. In one embodiment of the invention the first and second memory means are arranged to store first and second values of a state space variable of the modulator.

In an alternative embodiment of the invention the first and second memory means are arranged to store the last Q output bits of the output bitstream of the modulator after the associated iteration. Preferably the first and second memory means comprise first and second shift registers for storing the last Q output bits of the output bitstream of the modulator after the associated iteration.

Furthermore, in order to remove the tendency for limit cycles to be produced in the modulator output signal, disturbing means are preferably provided for applying a disturbance to an input of the modulator in response to an output from the detection means indicative of a tendency for limit cycles to be produced. This novel mechanism requires adding a small disturbance to the input in order to destroy the periodicity of the modulator's output sequence and to thereby remove the limit cycles. The previously suggested dither mechanism referred to in some of the prior art documents mentioned above is a poor method of limit cycle removal and disturbing the input is far more effective.

These limit cycle detection and removal mechanisms may be modified for use with feedback sigma delta modulators. They may be analysed to give quantitative results concerning the probability of false limit cycle detection, the time required for limit cycle removal, and the choice of parameters.

Either detection mechanism referred to above may be used with any method for removing the limit cycles, and the particular removal mechanism referred to above may be operated with (or even without) any detection method.

According to another aspect of the present invention there is provided a circuit for removing limit cycles in a sigma delta modulator having an output signal that varies over a series of iterations with respect to time, the circuit comprising:

detection means for providing an output indicative of a tendency for a limit cycle to be produced in the modulator output signal; and disturbing means for applying a disturbance to an input of the modulator in response to an output from the detection means indicative of a tendency for limit cycles to be produced, in order to remove the tendency for limit cycles to be produced in the modulator output signal.

According to a further aspect of the present invention there is provided a method of detecting limit cycles in a modulator having an output signal that varies over a series of time intervals, the method comprising:

storing a first value indicative of the level of the modulator output signal after a predetermined time interval;

storing a second value indicative of the level of the modulator output signal after a further time interval subsequent to the predetermined time interval;

comparing said first value stored in the first memory means with said second value stored in the second memory means; and providing, in response to such comparison, an output indicative of a tendency for limit cycles to be produced in the modulator output signal.

In order that the invention may be more fully understood, reference will now be made, by way of example, to the accompanying drawings, in which.

A convenient way to describe the time domain behaviour of an SDM is the state space description. This represents the state of the SDM at any time as a matrix operation applied to the state at the previous clock cycle. The power of the state space description is that it allows a very compact description of the state of the SDM from time t=0 to time t=n to be created.

For an $N^{th}$ order feedforward (or iterative) SDM, $$s(n+1)=As(n)+(u(n)-y(n))d. \quad (1)$$

where u is the input at iterate n, and y is the output, plus or minus one, determined by $$y(n) = \text{sgn}\left(\sum_{i=1}^{N} c_i s_i(n)\right) \quad (2)$$

Figure 1:
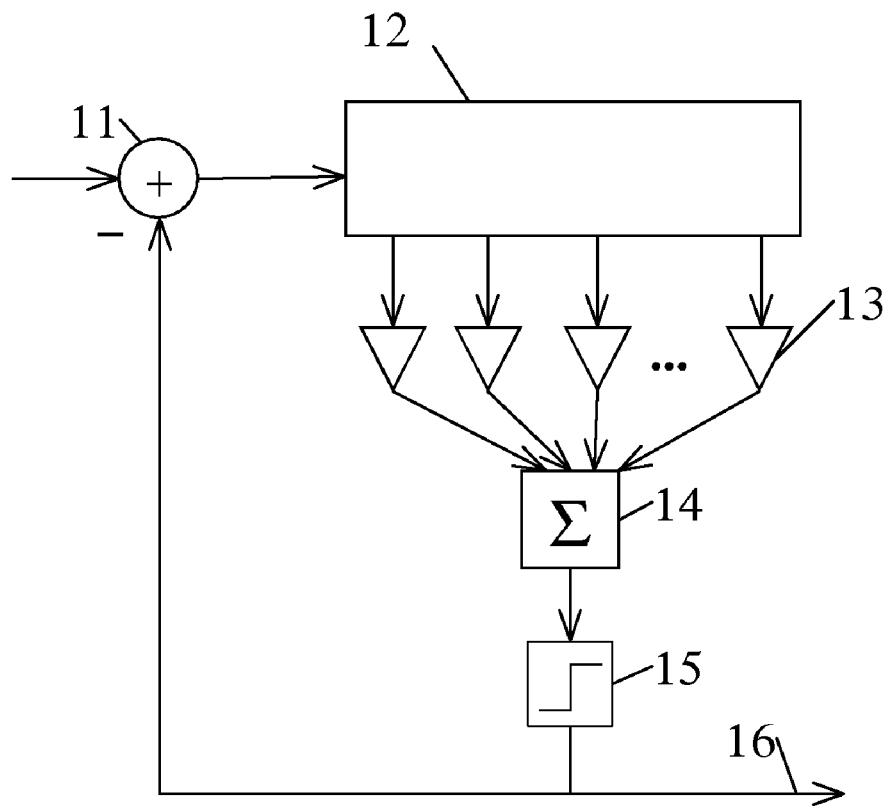
FIG. 1 is a block diagram of a generic feedforward SDM.
Figure 2:
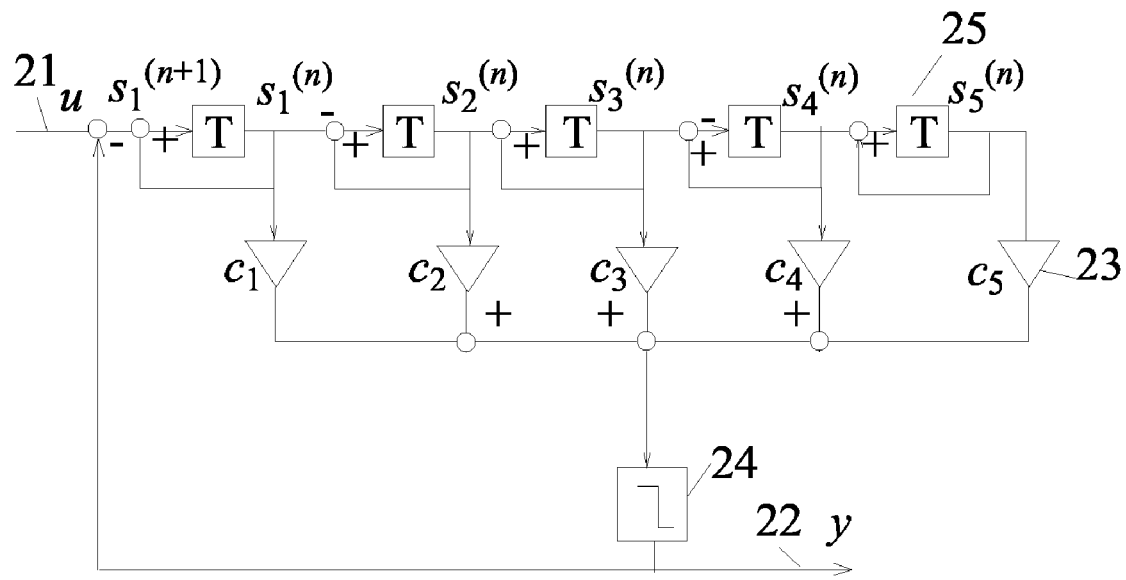
FIG. 2 is a block diagram of a fifth order SDM.

This description gives the state s of the SDM, at iterate n, in terms of a transition matrix A applied to the previous state vector, and a vector d applied to the scalar quantisation error, u(n)−y(n). FIG. 2 is an example of a typical fifth order SDM. In operation of such an SDM an input signal u is applied by way of an input 21 to five integrators 25 at iterate n, and an output signal y is obtained at an output 22 representing plus or minus one. Five amplifiers 23 multiply the state space variables outputted by the integrators 25 by coefficients $c_1, c_2, \ldots c_N$ so as to provide outputs that are summed and quantised in a quantiser 24. The coefficients c determine the noise shaping characteristics, and each integrator 25 provides a unitary delay T.

For the fifth order sigma delta modulator shown in FIG. 2, $d=(1,0,0,0,0)^T$ and the transition matrix is $$A = \begin{pmatrix} 1 & 0 & 0 & 0 & 0 \\ 1 & 1 & 0 & 0 & 0 \\ 0 & 1 & 1 & 0 & 0 \\ 0 & 0 & 1 & 1 & 0 \\ 0 & 0 & 0 & 1 & 1 \end{pmatrix} \quad (3)$$

This compact representation gives the means to directly view the consequences of a limit cycle. If the limit cycle has period P we have, by definition, $$y(n+P)=y(n) \quad (4)$$

An important assumption in earlier work is that a periodic bit output pattern implies a periodic orbit in state space variables. In D. Reefman, J. D. Reiss, E. Janssen, and M. Sandler, "Description of limit cycles in Sigma Delta Modulators" referred to above, it was proven that, in general, a limit cycle in the output bitstream exists if and only if there is a limit cycle in the state space variables. This means that equation (4) is equivalent to $$s(n+P)=s(n) \quad (5)$$

Although, in its pure definition, a limit cycle is a periodic pattern of infinite duration, in practical situations finite duration periodic sequences can be equally annoying. Thus a limit cycle detection and removal algorithm should be successful even if equation (5) is only true for a finite number of values. It follows that it should be possible to detect and remove limit cycles when equation (4) is approximately true for a finite time.

1. State Space-Based Limit Cycle Detection

In this section a preferred method for detecting limit cycles in feedforward SDMs in accordance with the invention will now be described.

Equation (5) provides a simple method of determining if a limit cycle exists. At a given iteration which we set to 0, s(0) may be stored in a buffer. For each successive iteration, 1, 2, ... i, ... up to some value $P_{max}$, s(i) is computed. If constant input is applied and, for some i, s(i)=s(0), then the theorem described in the previous section guarantees that a limit cycle of period P exists.

This method, while exact, has three drawbacks. Firstly, it requires that a vector of size N be stored. At each time iteration, up to N comparisons must be made. This is unnecessarily complicated. Secondly, and more importantly, this does not allow for a simple method of making approximate comparisons. When the state space variables are very close to a limit cycle condition, periodic output may be sustained long enough to be problematic. An appropriate measure of the required proximity of the state space variables needed for temporary limit cycle behaviour is not obvious and may not be simple to compute.

To alleviate this difficulty, it is proposed to compute a single scalar quantity at each iteration. It should be noted that the effect of a small change in the state space variables tends, over time, to yield a larger change in the later state space variables. The cumulative nature of the integrators implies that $s_N$ varies far more rapidly than any other state space variable.

If a small perturbation δ is applied to the state space variables, then that perturbation grows at a rate given by $$\delta(n)=A^n\delta(0) \quad (6)$$

Repeated application of the transition matrix A yields the binomial coefficients $$A_{ij}^n = \begin{cases} 0 & \text{if } i < j \\ \binom{n}{n-(i-j)} & \text{otherwise} \end{cases} \quad (7)$$

Thus, the terms of $\delta(n)=A^n\delta(0)$ are given by $$\delta_i(n) = \binom{n}{n}\delta_i(0) + \binom{n}{n-1}\delta_{i-1}(n) + \ldots + \binom{n}{n-i+1}\delta_1(n) \quad (8)$$

Figure 3:
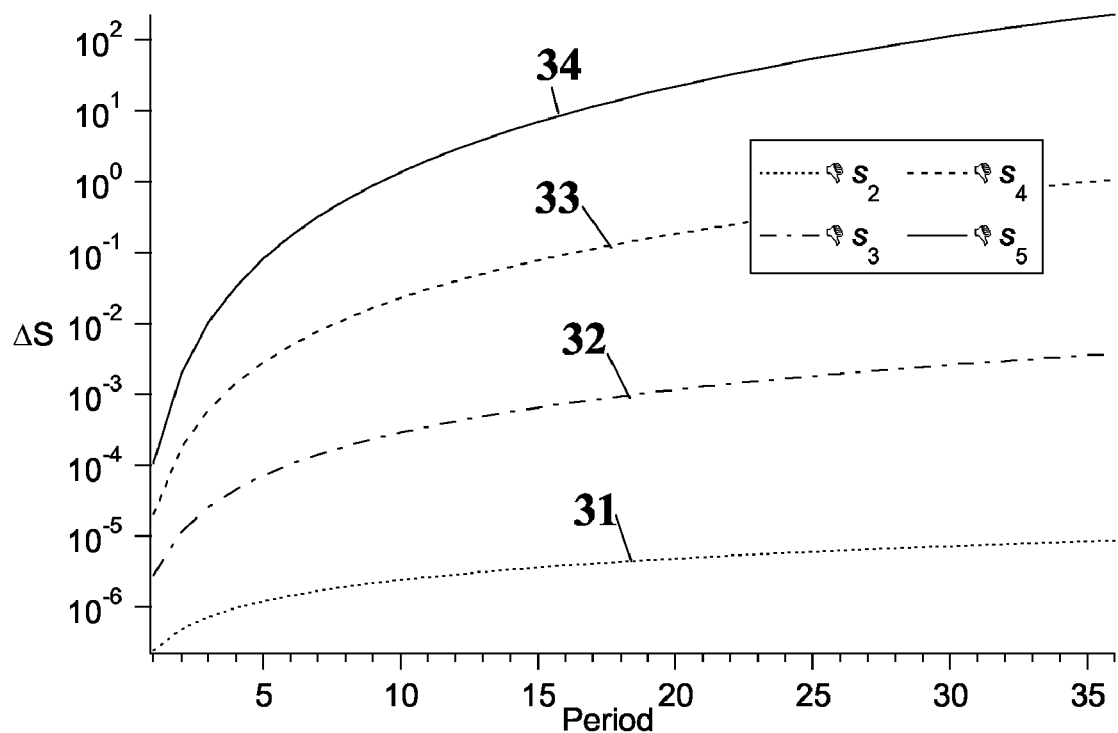
FIG. 3 is a plot depicting the growth of a disturbance to the state space variables as a function of the clock cycle, for a fifth order SDM.

Thus typically, $\delta_1(n)<\delta_2(n)\ldots<\delta_N(n)$. This is illustrated in FIG. 3, which is a graph in which curves 31, 32, 33, and 34 are shown depicting the growth of each of the variables $\Delta s_2, \Delta s_3$, $\Delta s_4$, $\Delta s_5$, where $\Delta s_i(nP)=s_i(nP)-s_i(0)$ for a small perturbation ($10^{-8}$) away from a period P=24 limit cycle. Thus, when the system is near a limit cycle, $s_1, s_2, \ldots s_{N-1}$ will vary almost periodically, whereas $s_N$ will diverge away from periodic behaviour. This implies that, when the system is near a limit cycle, there may be considerable variability in $s_N$.

It should be noted that this is independent of the choice of the coefficients $c_1, c_2, \ldots c_N$. The coefficients typically differ greatly in value. For a low pass sigma delta modulator, $c_1 > c_2 > \ldots > c_N$. This also implies that $s_N$ may vary greatly with the output bitstream unaffected.

$s_N$ is thus ignored in computing whether we are near a limit cycle. By not comparing $s_N$, it is possible to find short term limit cycles where the state space variables are not exactly repeating but the output bitstream may remain periodic long enough to be problematic.

Figure 4:
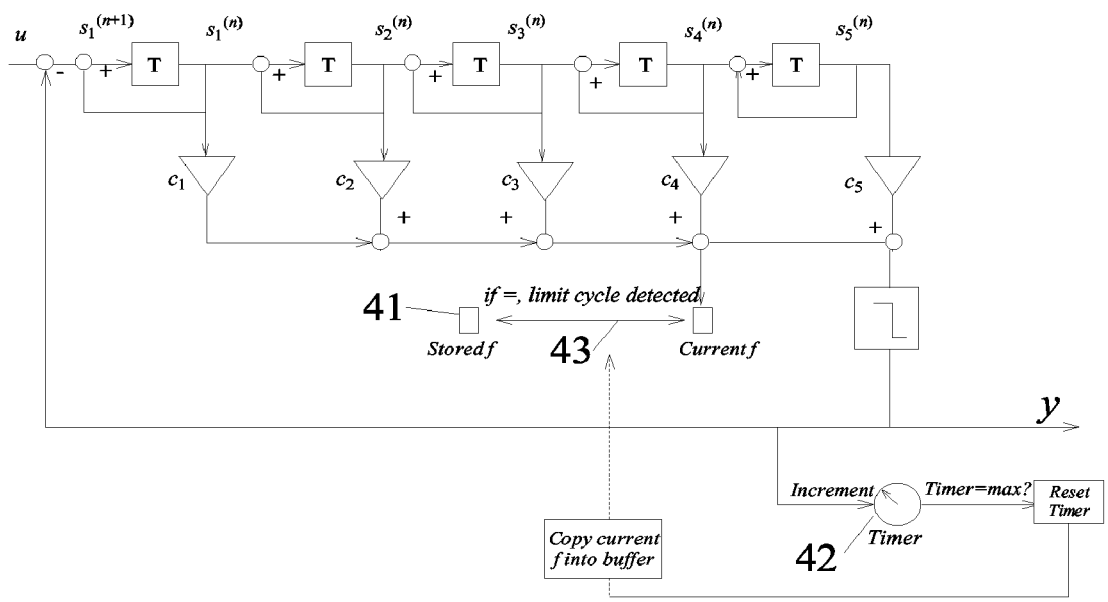
FIG. 4 is a block diagram of a fifth order SDM with a state-space-based limit cycle detector.

FIG. 4 is a block diagram of a fifth order SDM with a bitstream-based limit cycle detector. This SDM is similar to the SDM of FIG. 2, except that a limit cycle detector has been added. The limit cycle detector stores a first variable value in a buffer 41 indicative of the level of the output signal after a predetermined time interval, compares the first value in the buffer 41 with a second value indicative of the level of the output signal after a further time interval in a comparator 43, and then copies the current value into the buffer 41 after a time determined by the timing circuit 42.

In order to have a scalar quantity for comparison, as well as to take into account the differing sizes of the variables, use is made of a stored variable $$f(n) = \sum_{i=1}^{N-1} c_i s_i(n) \quad (9)$$

Thus, if a limit cycle of period P exists, $$f(n+P) >> f(n) \quad (10)$$

For a given iteration $n_0$, the value $f(n_0)$ is stored and a check is made to determine whether $f(n_0+i) >> f(n_0)$ holds for each successive iteration $n_0+1, n_0+2, \ldots n_0+i$. If it does, then the limit cycle removal algorithm is applied.

After a number of iterations R, the buffer is reset from $f(n_0)$ to $f(n_R)$. This allows limit cycles to be identified that appear at later iterations. However, it also implies that some limit cycles of period P>R may not be identified. The value of R is quite high, since long period limit cycles are problematic. However, a maximal value should be only a small multiple of the oversampling ratio. Otherwise, a limit cycle with period P<R may sometimes persist for long enough to be problematic. As an example, for an audio signal sampled at 64×44.1 kHz (64 times OSR), R=320=5×OSR performs well under a wide variety of circumstance.

It is possible that equation (10) may hold when limit cycle behaviour is not happening, but such an occurrence would be very rare. It occurs with a probability of the order of the digital precision of the hardware, e.g., if there are $2^{16}$ bits precision and f ranges over values from −A to A, then it would occur with a probability close to $1/(2^{17}A)$.

Figure 5:
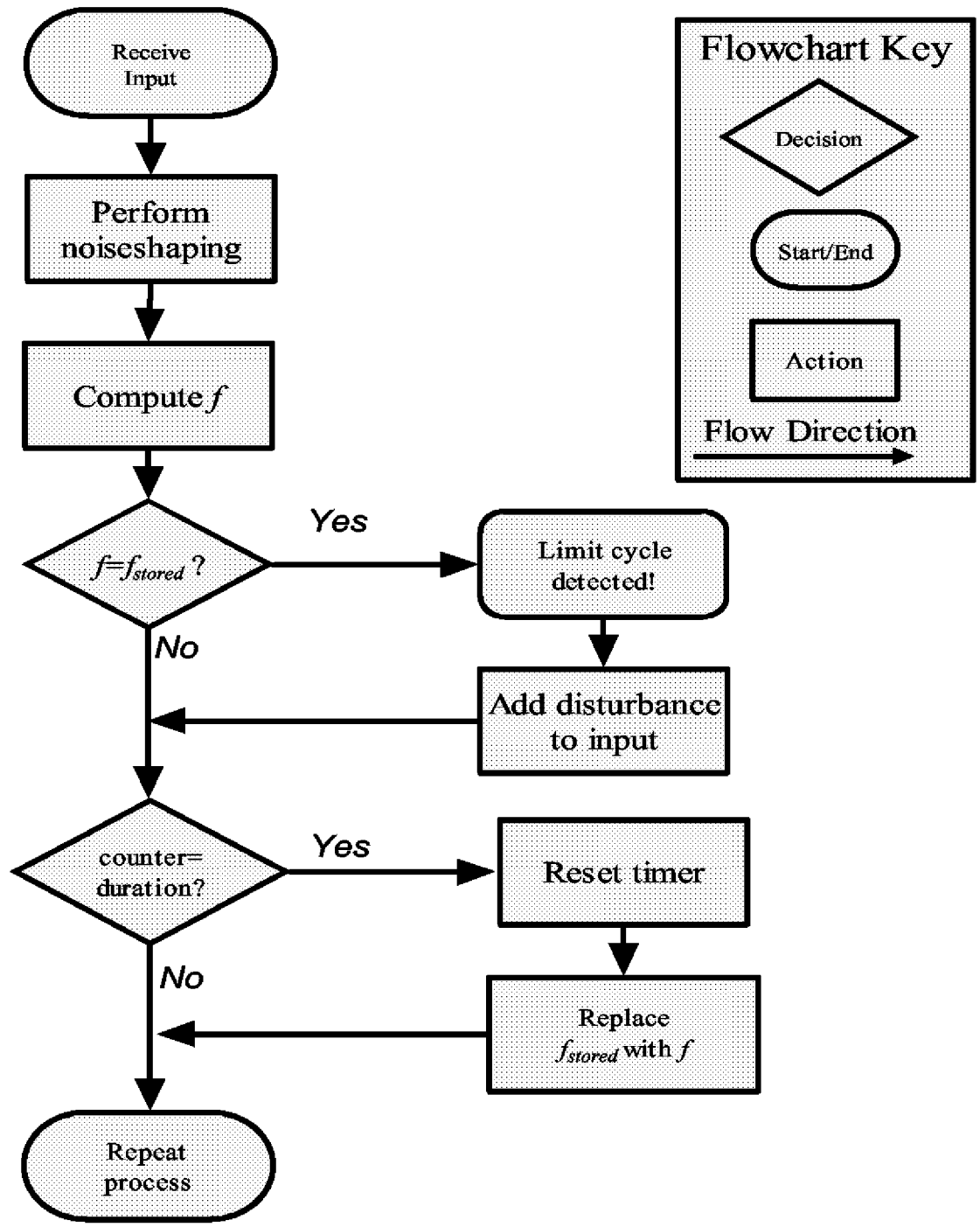
FIG. 5 is a flow chart depicting the operation of a state-space-based limit cycle detection and removal for an arbitrary SDM.

This limit cycle detection procedure may be continued indefinitely. The method is robust to the choice of parameters and may be used to detect any limit cycle. A flow chart depicting this method is given in FIG. 5.

Figure 6:
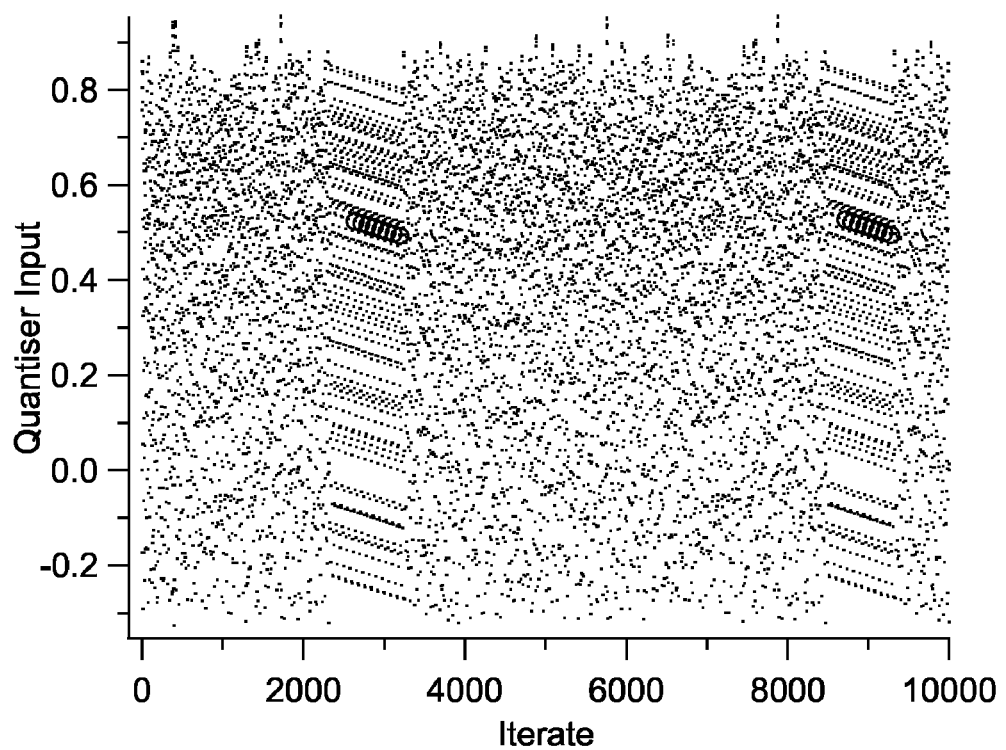
FIG. 6 is a plot of the input to the quantiser as a function of the number of iterations.

As an example, consider the fifth order sigma delta modulator given by D. Reefman, J. D. Reiss, E. Janssen, and M. Sandler, "Description of limit cycles in Sigma Delta Modulators" referred to above $c_1=0.5761069262$, $c_2=0.1624753515$, $c_3=0.0276093301$, $c_4=0.0028053934$, $c_5=0.0001360361$ With an input of 0.7, and initial conditions s=0, it exhibits limit cycle behaviour. FIG. 6 is a plot of the input to the quantiser as a function of the iteration and shows a time series of the input to the quantiser. The circled points represent those points where limit cycle behaviour has been identified. Clearly, limit cycle behaviour has been correctly identified. The time lag between the start of the limit cycle and the identification of limit cycle behaviour is due to the fact that the limit cycle has been running for approximately 200 iterations before the buffer is reset to a value for f which represents the limit cycle.

Figure 7:
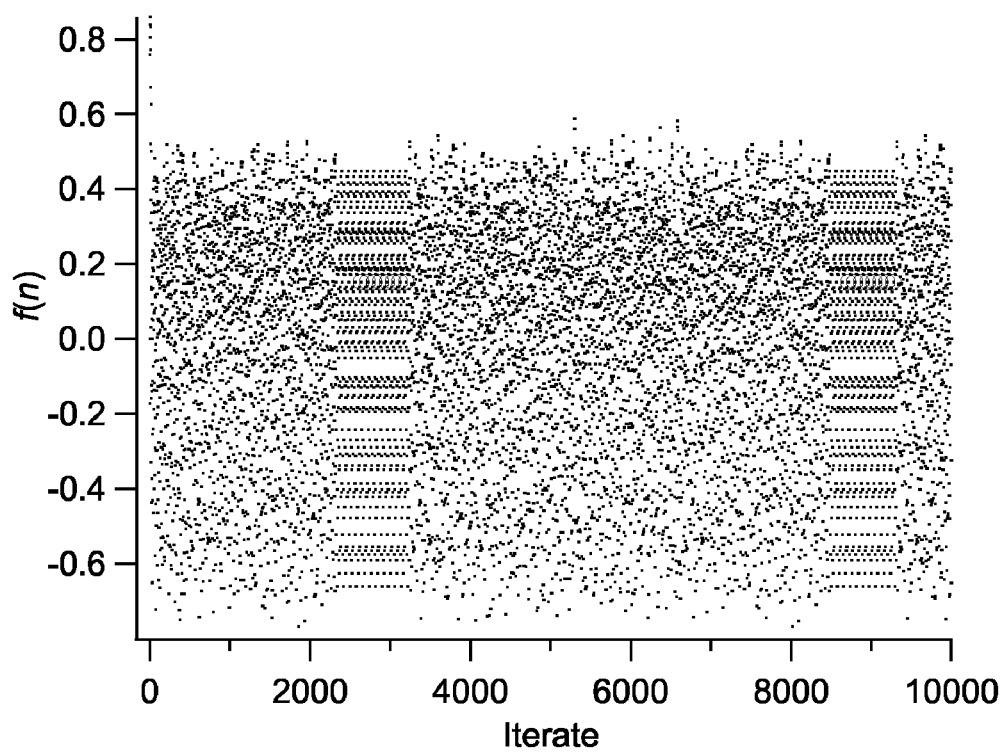
FIG. 7 is a plot of f as a function of the number of iterations.

This may be contrasted with FIG. 7 which is a plot of the function f, as defined in equation (6), as a function of the iteration. It can be seen that, when approximate limit cycle behaviour occurs, although $s_N$ may drift, f(n) remains periodic. The circled points again represent where limit cycle behaviour has been identified.

2. Limit Cycle Detection at the SDM Output

In this section an alternative preferred method for detecting limit cycles in feedforward SDMs in accordance with the invention using only shift registers will now be described.

Shift registers and bit comparisons are often much easier to implement than any circuitry (analogue or digital) for comparison of real numbers. Furthermore, one can conceive of situations where it is easier to access the output bitstream than the state space variables. Thus, it is desirable to consider methods of detecting limit cycles using bit comparisons alone.

A naïve approach would be to implement many shift registers, each one representing periodic output for a different limit cycle. The current output could then be compared with each shift register to see if it appears that limit cycle behavior is occurring. However, this would require of the order of $2^P$ shift registers, and $2^P$ comparisons. Since a limit cycle represents a repeating pattern in the bitstream, it suffices to identify bitstream repetition. To do this, the outputs of two shift registers are compared, one representative of the current bitstream output and the other representative of the bitstream output at a previous iteration. For this method, there are two parameters of importance, namely the shift register length Q and the shift register duration or persistence R (the number of iterations until the stored shift register is reset).

Figure 8:
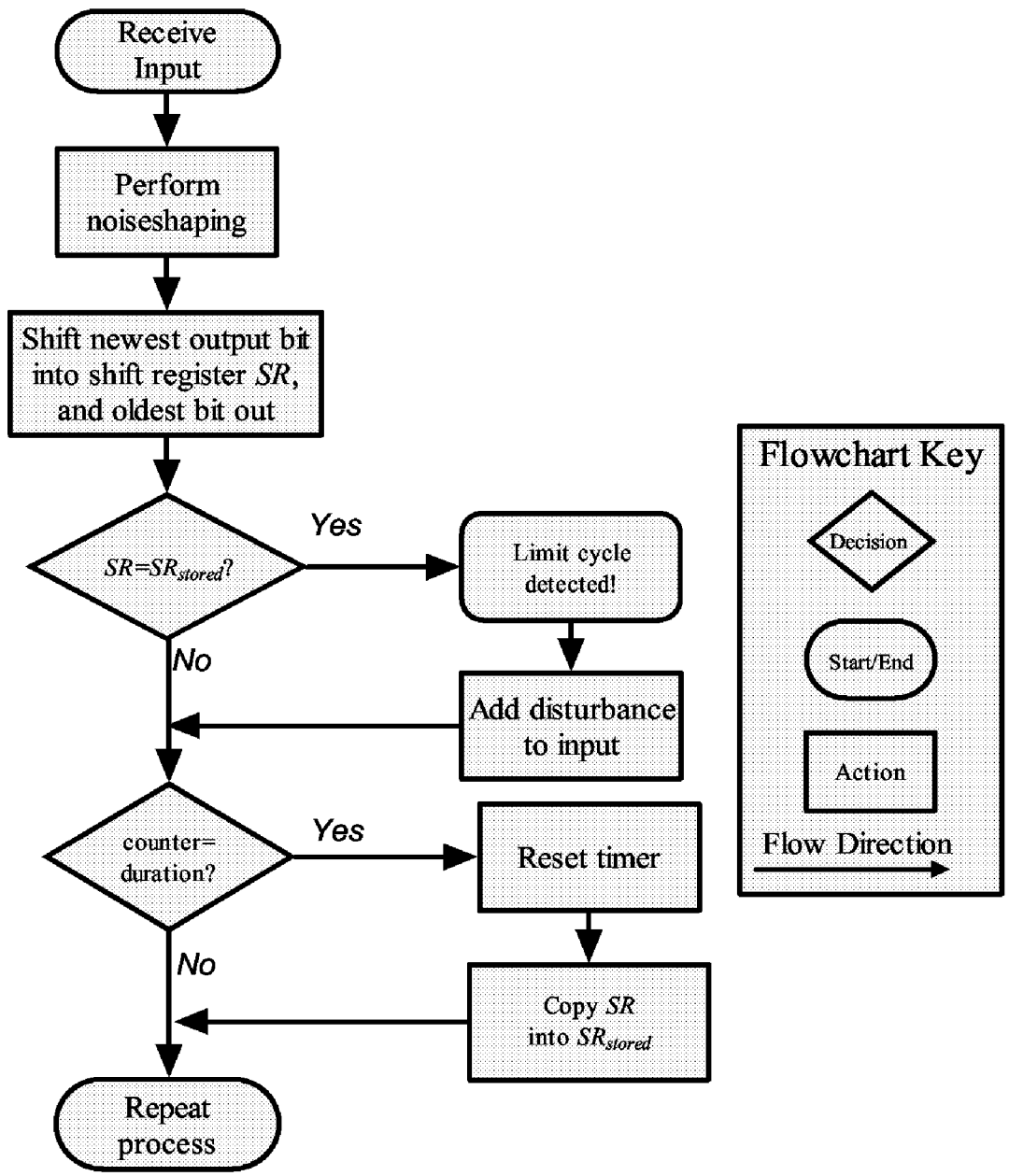
FIG. 8 is a flow chart depicting the operation of a bitstream-based limit cycle detection and removal mechanism, using shift registers, for an arbitrary SDM.

FIG. 8 is a flowchart depicting the operation of such a limit cycle detection and removal mechanism, using shift registers, for an arbitrary SDM. The algorithm is as follows:

Keep a shift register SR of the last Q output bits.
After every $R^{th}$ iterate, copy the shift register SR into the shift register $SR_{stored}$.
If, at any iterate, the samples stored in the two shift registers exactly match, $SR_{current}=SR_{stored}$, then a limit cycle has been detected.

Figure 9:
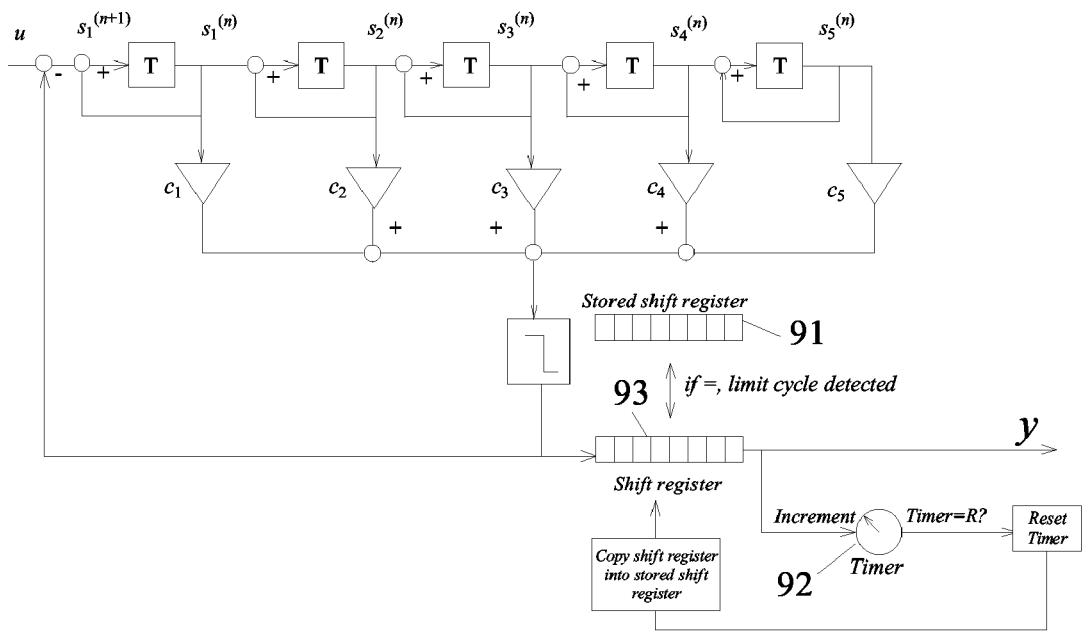
FIG. 9 is a block diagram of a fifth order SDM with a bitstream-based limit cycle detector.

A block diagram of a fifth order SDM with a bitstream-based limit cycle detector, including noise shaping, is shown in FIG. 9. The bitstream-based limit cycle detector stores output bits in a shift register at 91, compares the values in the shift register 91 and a current shift register 93, and then copies the value in the current shift register into the shift register 91 after a time determined by the timing circuit 92.

It should be noted that comparison of bits in the shift register, as well as copying of bits between shift registers, can be done in parallel. Thus there is no need for any operation to be performed faster than the sampling frequency of the SDM.

Such a method guarantees that a limit cycle (even a short one) is not detected until after Q iterates. On the other hand, limit cycles of a period longer than Q are still identifiable, since this also requires matching of the recent bitstream with the stored values in the buffer. Thus, Q is typically made smaller than the value R.

The method is robust both to the size of the shift register, and the choice of when the shift register is reset. More significant is the choice of shift register persistence R. If it is supposed that we are in a limit cycle of length P, where R<P. At iteration 0 the buffer is set. The sequence will thus be repeated next at time P, but, before that can be identified, the buffer is reset at iteration R. Thus limit cycles of period greater than the buffer duration will not be detected. On the other hand, if we are in a limit cycle of length P≦R then, every R iterates, the limit cycle will be detected $\lfloor R/P \rfloor$ times, where $\lfloor \; \rfloor$ denotes the largest integer less than or equal to. Conversely this implies that a limit cycle is detected at most once per period, and at least once every other period.

Figure 10:
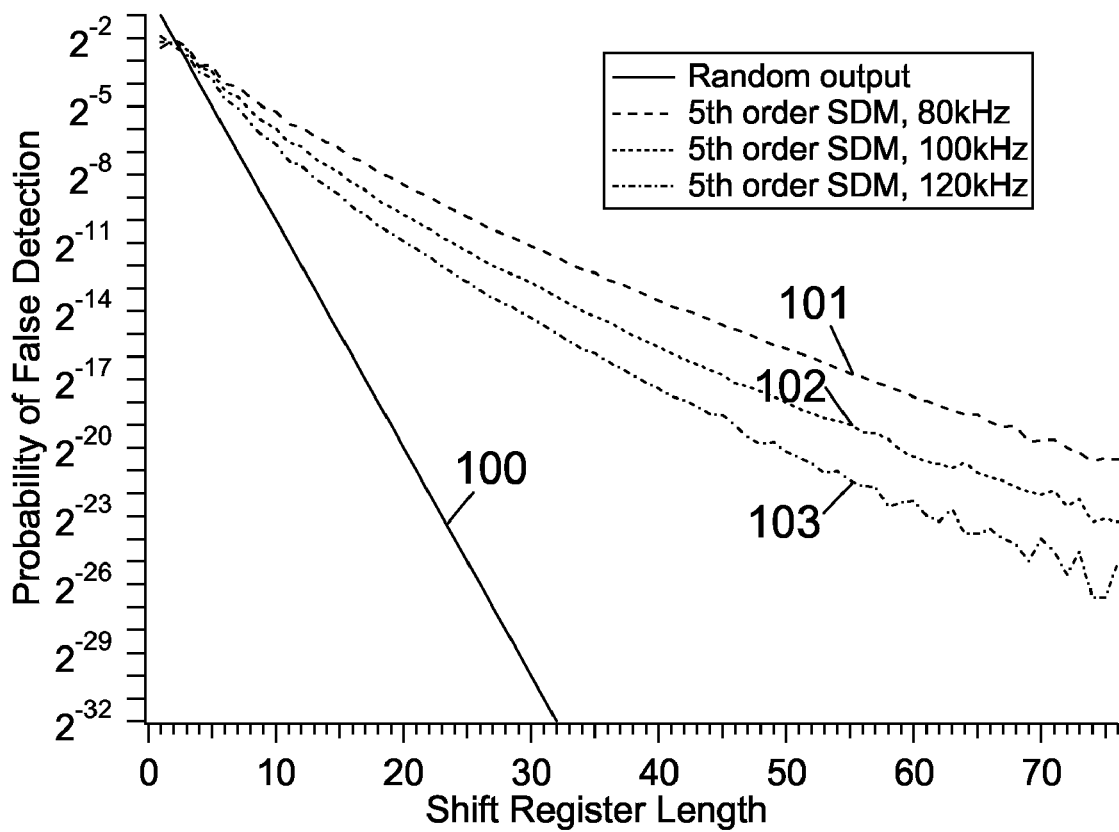
FIG. 10 is a plot of the probability of falsely detecting a limit cycle as a function of shift register length.

False detections are very rare. If the output is truly random, then false detections occur with a probability $2^{-Q}$. However, the output is far from random. This is partly due to the fact that the input is not random (band limited, with amplitude safely within stability limits), but also because the sigma delta modulation prevents certain sequences from occurring, regardless of input. FIG. 10 is a plot of the probability of falsely detecting a limit cycle as a function of buffer length Q incorporating a line 100 corresponding to a random output and lines 101, 102 and 103 corresponding to outputs from $5^{th}$ order SDMs at 80 kHz, 100 kHz and 120 kHz respectively. In each case, the buffer duration R was set equal to the buffer length Q. Each data point was generated using 100 one million point long sequences (after initial startup transients were removed), where each sequence has as input a sinusoid with a randomly generated frequency between 80 and 130 kHz, and random initial conditions. It can be clearly seen that, though the probability of a false detection is far greater than would be the case for a truly random sequence, it is still low enough to be insignificant.

3. Limit Cycle Removal

Figure 11:
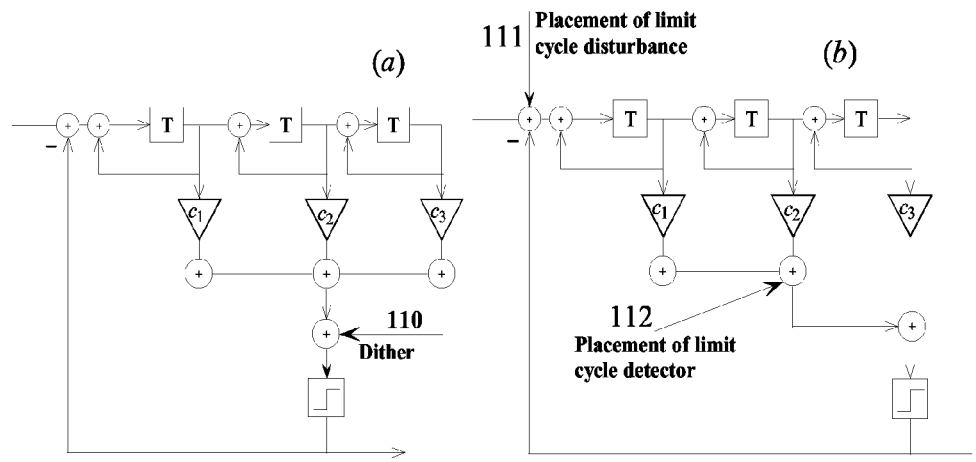
FIG. 11 shows two block diagrams of a third order SDM comparing the standard placement of (a) dither with (b) the proposed limit cycle detection and removal.

In D. Reefman, J. D. Reiss, E. Janssen, and M. Sandler, "Description of limit cycles in Sigma Delta Modulators" referred to above, it was shown that the application of dither at a location 110 just before the quantiser, as shown in the block diagram of a third order SDM of FIG. 11a, is a sub-optimal form of limit cycle removal. This is because it has no effect on the state space variables unless it results in a change to the output bitstream. On the other hand, any disturbance applied at the input 111 in response to detection of limit cycles at 112, as shown in the block diagram of a third order SDM of FIG. 11b, will affect all state space variables. So a limit cycle may be removed by simply perturbing the internal integrator states of a sigma delta modulator. Furthermore, the perturbation will be shaped according to the noise-shaping characteristics of the SDM. Thus, it is recommended that a small perturbation be added to the input 111 of the sigma delta modulator whenever a limit cycle has been detected.

The choice of the size of the disturbance that is added is a trade-off between the reduction in SNR and instability when a large disturbance is added, and the increased amount of time it may take to destroy a limit cycle when a small disturbance is added. However, this is a minor issue since, within a large range, the size of the disturbance has only a minimal effect on stability, SNR, or the time it takes to destroy the limit cycle. Even a disturbance of the order of $10^{-8}$ (akin to a change of less than −140 dB) is sufficient to eliminate the limit cycle long before it becomes problematic.

Since this modification is both minimal and guaranteed to work, it is preferable to the commonly used alternative of adding dither or noise to the input to the quantiser. The perturbation only needs to be added when a limit cycle has been detected. Furthermore, since the limit cycle is unstable, only a very small disturbance needs to be added.

Compared to conventional dithering techniques that add random noise to the input of the quantizer, this novel limit cycle detection and removal technique and apparatus has a higher allowed input dynamic range and higher signal-to-noise-plus-distortion-ratio (SNDR). It may also be implemented successfully without the use of a limit cycle detector.

Figure 12:
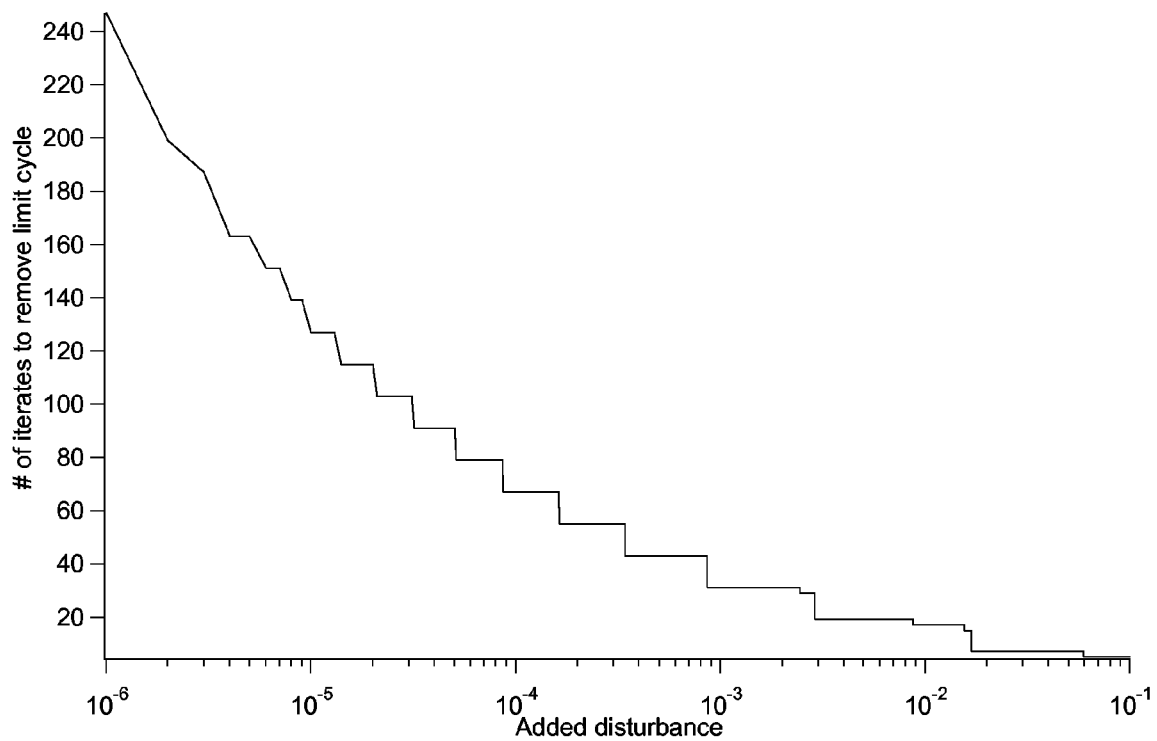
FIG. 12 is a graph of added disturbance against number of iterations of a fifth order SDM.

FIG. 12 demonstrates how the size of the disturbance affects the time it takes to destroy a limit cycle. The number of iterates before a limit cycle is removed as a function of the size of the perturbation applied. This is a worst case scenario where the initial conditions have been set to produce the most stable period 12 limit cycle possible for a fifth order SDM having a corner frequency of 100 kHz. Not only have the initial conditions of the modulator been chosen to guarantee that the dynamics fall exactly on a limit cycle, but they have also been chosen so that the initial conditions are as far as possible from those that would produce a bit flip and thus destroy the limit cycle. Nevertheless, even a disturbance of the order of $10^{-6}$ is sufficient to eliminate the limit cycle long before it becomes problematic.

4. Limit Cycle Detection in Feedback SDMs

Figure 13:
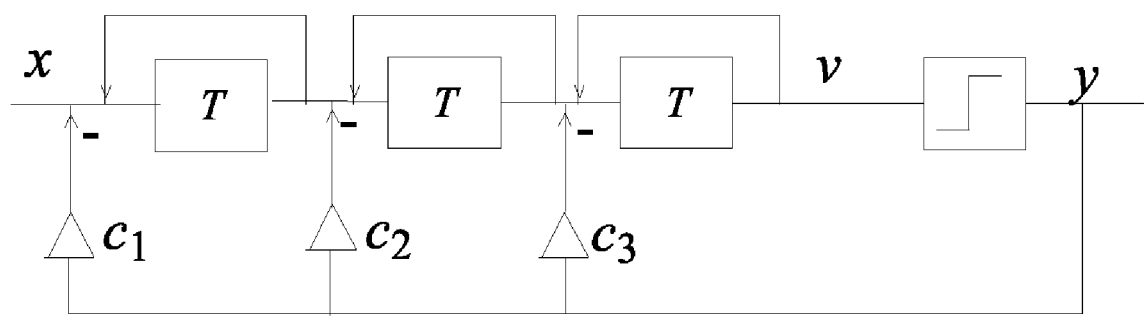
FIG. 13 is a block diagram of a third order SDM.

A popular alternative design to the feedforward, or interpolative, SDM, is the feedback SDM. This is often used when a superior anti-aliasing effect of the signal transfer function is required. FIG. 13 is a block diagram of a third order feedback SDM. This represents a typical SDM design, which is often used in practical designs, such as that disclosed by D. Reefman and E. Janssen, "Signal processing for Direct Stream Digital: A tutorial for digital Sigma Delta modulation and 1-bit digital audio processing," Philips Research, Eindhoven, White Paper 18 Dec. 2002. We can easily see that, for the modulator presented here, $$s^{(n+1)} = As^{(n)} + u^{(n)}d - y^{(n)}c$$

$$y^{(n)} = \text{sgn}(s_N^{(n)}) \qquad (11)$$

where y(n) is the output bit at clock cycle n, and $s_i(n)$ are the integrator outputs, called state variables. The last integrator output, $s_N(n)$, is also the quantiser input signal.

The propagation of the states s can be written in matrix notation as:

$$s^{(n)} = A^n s^{(0)} + \left[ \sum_{i=0}^{n-1} A^{(n-i-1)}(u^{(i)}d - y^{(i)}c) \right] \qquad (12)$$

where c is a vector of feedback coefficients, A is an N×N transition matrix for an SDM of order N, and $c=(c_1, \ldots, c_N)^T$ and d describe how the input and feedback respectively are distributed.

It is interesting to compare this with the equivalent feedforward design, where the state space equations are given by equations (1) and (2). For both designs, the placement of the transition matrix A in the state space equations is identical. However, for feedforward designs, the coefficient vector has no direct effect on the state space variables s, and only acts as a weighting term on the quantisation, whereas, for the feedback design, the coefficient vector acts as a constant that is added or subtracted from the state space variables on every iteration. This implies that the dynamics of feedback and feedforward designs are very similar, but modifications must be made in limit cycle detection and removal mechanisms.

A limit cycle occurs when the input to the quantiser repeats. Here, short period limit cycles are very rare. For state variable-based detection, it is not necessary to identify limit cycles using anything other than the quantiser input.

In the above a method of detecting limit cycles based on the state space variables has been described and a method of detecting limit cycles based only on analysis of the output bitstream has subsequently been described. Either of these methods may be combined with the limit cycle removal method described to yield a highly effective limit cycle detection and removal method that does not require continual dithering. Various implementations are described below by way of example.

The first two implementations described above are preferred embodiments. The following implementations are variations that can also be carried out within the scope of the invention:

a. A one-bit sigma delta modulator, of arbitrary order, arbitrary design (feedforward, feedback or otherwise) and without dither applied to the quantiser, using the method described in Section 2 to detect the occurrence of limit cycles, and the method described in Section 3 to remove the limit cycles.

b. A one-bit feedforward sigma delta modulator, of arbitrary order and without dither applied to the quantiser, using the method described in Section 1 to detect the occurrence of limit cycles, and the method described in Section 3 to remove the limit cycles.

c. A multibit sigma delta modulator, of arbitrary order, arbitrary design (feedforward, feedback or otherwise) and without dither applied to the quantiser, using the method described in Section 2 to detect the occurrence of limit cycles, and the method described in Section 3 to remove the limit cycles.

d. A multibit feedforward sigma delta modulator, of arbitrary order and without dither applied to the quantiser, using the method described in Section 1 to detect the occurrence of limit cycles, and the method described in Section 3 to remove the limit cycles used.

e. Any sigma delta modulator, using the method described in Section 1 to detect the occurrence of limit cycles, regardless of the limit cycle removal mechanism used.

f. Any sigma delta modulator, using the method described in Section 2 to detect the occurrence of limit cycles, regardless of the limit cycle removal mechanism.

The invention claimed is:

1. A circuit comprising:
   first memory means for storing a first value indicative of a first level of a sigma delta modulator output signal after a first iteration, wherein said sigma delta output signal varies over a series of iterations with respect to time;
   second memory means for storing a second value indicative of a second level of the output signal after a second iteration subsequent to the first iteration;
   comparison means for comparing said first value stored in the first memory means with said second value stored in the second memory means; and
   detection means for providing, in response to said comparing, an output indicative of a tendency for limit cycles to be produced in the output signal.

2. The circuit according to claim 1, wherein the first and second memory means are arranged to store first and second values of a state space variable of the modulator.

3. The circuit according to claim 2, wherein the state space variable is a function of the form $$f(n) = \sum_{i=1}^{N-1} c_i s_i(n)$$

wherein N is the order of the modulator and the modulator comprises a plurality of filter stages, $c_i$ is the noise shaping coefficient of each stage, $s_i$ is the output of each stage, and n is the given iteration.

4. The circuit according to claim 1, wherein the first memory means comprise a first shift register and the second memory means comprises a second shift register configured to store the last Q output bits of an output bitstream of the modulator after an associated iteration, wherein Q is a shift register length of the first shift register and a shift register length of the second shift register.

5. The circuit according to claim 4, further comprising reset means for resetting the first value stored in the first shift register after a preset number R of iterations following the first iteration.

6. The circuit according to claim 5, wherein the reset means is arranged to copy the contents of the second shift register into the first shift register after the preset number R of iterations.

7. The circuit according to claim 1, wherein the comparison means is arranged to compare said first value stored in the first memory means with said second value stored in the second memory means for a plurality of further iterations following the first iteration.

8. The circuit according to claim 1, further comprising disturbing means for applying a disturbance to an input of the modulator in response to the output from the detection means.

9. A circuit for removing limit cycles in a sigma delta modulator having an output signal that varies over a series of iterations with respect to time, comprising:
   detection means for providing an output indicative of a tendency for a limit cycle to be produced in a sigma delta modulator output signal, wherein said sigma delta modulator output signal varies over a series of iterations with respect to time and said detection means comprises:
      first memory means for storing a first value indicative of a first level of the output signal after a first iteration;
      second memory means for storing a second value indicative of a second level of the output signal after a second iteration subsequent to the first iteration; and
      comparison means for comparing said first value stored in the first memory means with said second value stored in the second memory means to provide the output indicative of the tendency for limit cycles to be produced; and
   disturbing means for applying a disturbance to an input of the modulator in response to the output from the detection means.

10. A method comprising:
   storing a first value indicative of a first level of a sigma delta modulator output signal after a first time interval, wherein said sigma delta output signal varies over a series of time intervals;
   storing a second value indicative of a second level of the output signal after a second time interval subsequent to the first time interval;

comparing said first value stored in the first memory means with said second value stored in the second memory means; and providing, in response to said comparing, an output indicative of a tendency for limit cycles to be produced in the output signal.

11. A circuit comprising:
a first memory for storing a first value indicative of a first level of a sigma delta modulator output signal after a first iteration, wherein said sigma delta output signal varies over a series of iterations with respect to time;
a second memory for storing a second value indicative of a second level of the output signal after a second iteration subsequent to the first iteration;
a comparator for comparing said first value stored in the first memory with said second value stored in the second memory; and
a detector for providing, in response to said comparing, an output indicative of a tendency for limit cycles to be produced in the output signal.

12. The circuit according to claim 11, wherein the first and second memory are arranged to store first and second values of a state space variable of the modulator.

13. The circuit according to claim 12, wherein the state space variable is a function of the form $$f(n) = \sum_{i=1}^{N-1} c_i s_i(n)$$

wherein N is the order of the modulator and the modulator comprises a plurality of filter stages, $c_i$ is the noise shaping coefficient of each stage, $s_i$ is the output of each stage, and n is the given iteration.

14. The circuit according to claim 11, wherein the first memory comprises a first shift register and the second memory comprises a second shift register configured to store the last Q output bits of an output bitstream of the modulator after an associated iteration, wherein Q is a shift register length of the first shift register and a shift register length of the second shift register.

15. The circuit according to claim 14, further comprising reset means for resetting the first value stored in the first shift register after a preset number R of iterations following the first iteration.

16. The circuit according to claims 15, wherein the reset means is arranged to copy contents of the second shift register into the first shift register after the preset number R of iterations.

17. The circuit according to claim 11, wherein the comparator is arranged to compare said first value stored in the first memory with said second value stored in the second memory for a plurality of further iterations following the first iteration.

18. The circuit according to claim 11, further comprising disturbing means for applying a disturbance to an input of the modulator in response to the output from the detection means.

19. A method comprising:
storing a first value indicative of a first level of a sigma delta modulator output signal after a first iteration, wherein said sigma delta output signal varies over a series of iterations with respect to time;
storing a second value indicative of a second level of the output signal after a second iteration subsequent to the first iteration;
comparing said first value stored in the first memory with said second value stored in the second memory; and
detecting, in response to said comparing, an output indicative of a tendency for limit cycles to be produced in the output signal.

20. The method according to claim 19, further comprising storing a first and a second value of a state space variable of the modulator.

21. The method according to claim 20, wherein the state space variable is a function of the form $$f(n) = \sum_{i=1}^{N-1} c_i s_i(n)$$

wherein N is the order of the modulator and the modulator comprises a plurality of filter stages, $c_i$ is the noise shaping coefficient of each stage, $s_i$ is the output of each stage, and n is the given iteration.

22. The method according to claim 19, wherein the first value is stored in a first shift register and the second value is stored in a second shift register, wherein the first shift register and the second shift register are configured to store the last Q output bits of an output bitstream of the modulator after an associated iteration, wherein Q is a shift register length of the first shift register and a shift register length of the second shift register.

23. The method according to claim 22, further comprising resetting the first value stored in the first shift register after a preset number R of iterations following the first iteration.

24. The method according to claim 23, further comprising copying contents of the second shift register into the first shift register after a preset number R of iterations.

25. The method according to claim 19, further comprising comparing said first value stored in the first memory with said second value stored in the second memory for a plurality of farther iterations following the first iteration.

26. The method according to claim 11, further comprising applying a disturbance to an input of the modulator in response to the output indicative of the tendency for limit cycles to be produced.

* * * * *